United States Patent [19]

Fukuyama et al.

[11] 4,211,923
[45] Jul. 8, 1980

[54] FLUID TIGHT ULTRASONICALLY WELDED PHOTOELECTRIC DEVICE

[75] Inventors: Toshifumi Fukuyama; Hideaki Hattan, both of Kyoto, Japan

[73] Assignee: Omron Tateisi Electronics Co., Kyoto, Japan

[21] Appl. No.: 887,795

[22] Filed: Mar. 17, 1978

[30] Foreign Application Priority Data

Mar. 18, 1977 [JP] Japan .................................. 52/29967

[51] Int. Cl.² .......................... H01J 5/02; B29C 27/08
[52] U.S. Cl. ..................................... 250/239; 156/73.1
[58] Field of Search ............... 250/239; 156/73.1, 380; 350/245, 252

[56] References Cited

U.S. PATENT DOCUMENTS 4,051,365   9/1977   Fukuyama et al. ............... 250/222 R

OTHER PUBLICATIONS

Branson Sonic Power Company, "New Disposable Flashlight Ultrasonically Welded", Ultrasonic News, Spring 1970.

*Primary Examiner*—David C. Nelms
*Assistant Examiner*—Edward P. Westin
*Attorney, Agent, or Firm*—Stevens, Davis, Miller & Mosher

[57] ABSTRACT

A photoelectric switch comprising a housing which encloses at least a light emitting element or a light responsive element. The housing consists of two opaque plastic shells welded to each other by ultrasonic welding and a window means of transparent plastic simultaneously welded to the shells by said ultrasonic welding. The window means is formed and attached to the shells in such a manner that it includes no peripheral portion which is in parallel with the direction of ultrasonic welding pressure.

11 Claims, 8 Drawing Figures

FLUID TIGHT ULTRASONICALLY WELDED PHOTOELECTRIC DEVICE

BACKGROUND OF THE INVENTION

This invention relates to a photoelectric switch and, more particularly, to a photoelectric switch of a type having a housing consisting of two plastic shells welded together by ultrasonic welding.

A variety of photoelectric switches, namely photoelectric detectors, which utilize a light source element such as a light emitting diode and a light responsive element such as a photoelectric transistor for detecting the presence or absence of an article in the light path between said light source element and light responsive element are known. The elements are generally accomodated in a common housing, or accomodated each in an independent housing, said housing being made of metal or other opaque material and provided with a window means made of glass or plastic material which is transparent to light.

However, it is difficult to achieve a hermetic or fluid-tight seal between the housing and window means. It should be understood that the term "photoelectric switch" is used herein to refer not only to a device comprising a light source element and a light responsive element in a common housing but to a device comprising either a light source element or a light responsive element in a housing. Similarly, the term "light" is used herein to refer to any radiant electromagnetic energy in the far infrared to ultraviolet regions of the spectrum, including, but not limited to visible light.

It is an object of this invention to provide a photoelectric switch including a housing which is provided with a window means as welded thereto fluid-tight by ultrasonic welding.

Another object of this invention is to provide a photoelectric switch which is compact and simple in construction and easy to fabricate at low cost.

DESCRIPTION OF THE PREFERRED EMBODIMENTS

Figure 1:
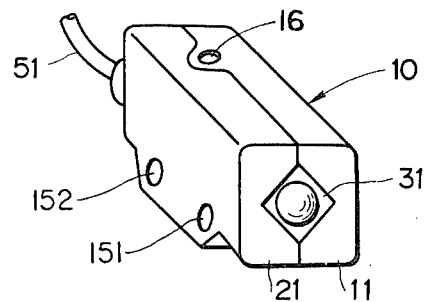
FIG. 1 is a perspective view showing an example of the photoelectric switch of this invention.
Figure 2:
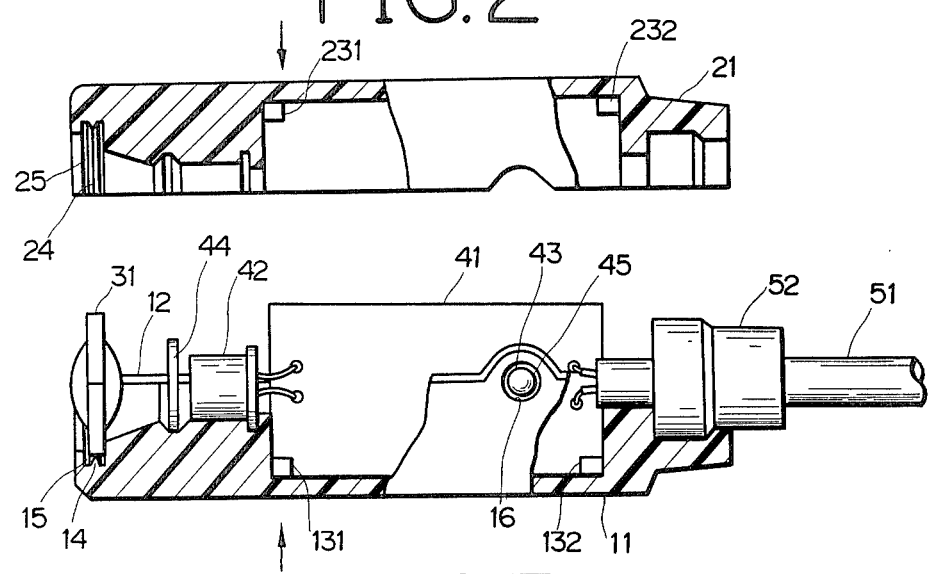
FIG. 2 is a diagrammatical schematic side view, in partial section, of the photoelectric switch of FIG. 1.
Figure 3:
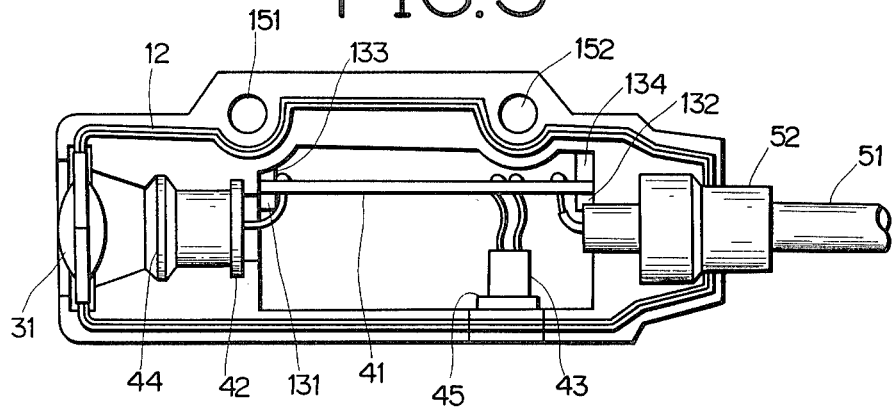
FIG. 3 is a plan view of a shell shown in FIG. 2.
Figure 4:
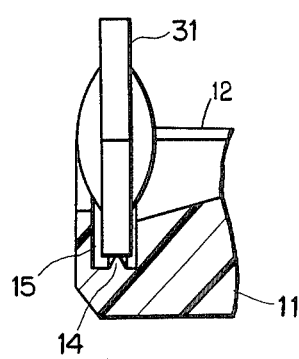
FIG. 4 is a segmental enlarged view of FIG. 2.

In FIG. 1 is shown an example of the completed photoelectric switch contemplated by this invention. The switch includes a housing 10 which consists of two mating shells 11 and 21, each made of opaque plastic material. The shells 11 and 21 are welded to each other by ultrasonic welding. The switch further includes a window means 31 of transparent plastic material, as simultaneously secured to the front wall of the housing 10 by said ultrasonic welding. An electric conductor 51 extends out of the housing 10 from the rear wall thereof. Referring, now, to FIG. 2 to FIG. 4, the shells 11 and 21 are each molded from a plastic material. The shells 11 and 21 and the window means 31, taken together, form a closed fluid-tight compartment as they are welded together by ultrasonic welding in a single operation, as will be described later. A circuit board 41 is positioned in and between shells 11 and 21, and supported securely in position by guide members 131, 132, 133, 134, 231, 232 and two other guide members which are not shown. A photoelectric transistor 42 electrically connected to the circuit board 41 is positioned within the housing to receive light from the exterior of the switch through window means 31 and an optical filter 44. While, in this embodiment, only infrared light passes through the optical filter 44, the filter 44 may have other filtering characteristics, or may be omitted. Alternatively, the window means 31 itself may be made of a plastic material with optical filtering characteristics. A light emitting diode 43 for indicating the operation of the switch, which is electrically connected to the circuit board 41, is inserted into a through-hole 16 of the shell 11 and secured in position by a rubber ring 45. Other circuit elements attached to the circuit board 41 such as amplifying circuit elements are omitted from the drawings. An electric conductor 51 is electrically connected to the circuit board 41 and is led out of the shells 11 and 21. The conductor 51 is secured in position relative to the shells 11 and 21 by means of a rubber ring 52. The shells 11 and 21 are each provided with a pair of corresponding mounting holes 151 and 152 so that the switch may be mounted on any surface desired. The window means 31 having a square configuration is a plastic molding of transparent plastic material. Said window means 14 has a convex surface, as formed in the manner of the conventional optical convex lens.

The window means 31 is positioned in a recess 15 of shell 11 and a recess 25 of shell 21. The shells 11 and 21 are provided with projections 14 and 24, as located in said recesses 14 and 24, respectively, so that when said shells and window means are simultaneously welded together by ultrasonic welding, said projections 15 and 25 abut against and are welded to the entire periphery of said window means 31. A projection 12 is formed on an inside surface of the shell 11.

By applying pressure for ultrasonic welding, in the direction indicated by the arrowmark in FIG. 2, the shells 11 and 21 are welded together over the entire projection 12. Simultaneously, the window means 31 is welded to the shells 11 and 21. The projections 14, 24 and 12 provide for a concentration of ultrasonic energy, contributing to an improved ultrasonic welding result. The projection 12, which may for example be 0.4 mm in height, is approximately twice as high as the projection 14, 24 so that the welding of shells 11 and 21 to each other and the welding thereof to window means 31 are simultaneously and uniformly accomplished.

It should be understood that the window means 31 is disposed in such a position as will not present any of its peripheral portion in parallel with the direction of welding pressure, whereby a dissipation of ultrasonic energy is precluded. Thus, in this embodiment, the window means 31 which has a square configuration is attached to shells 11 and 22 in such a manner that a diagonal line of the square is coincident with the welding plane of shells 11 and 12. Then, the ultrasonic energy is effectively distributed over the entire periphery of the window means 31 and the window means 31 and shells 11, 21 are welded together in fluid-tight relation. It should, of course, be understood that the projections 14 and 24 may be formed on the periphery of the window means 31.

Figure 5:
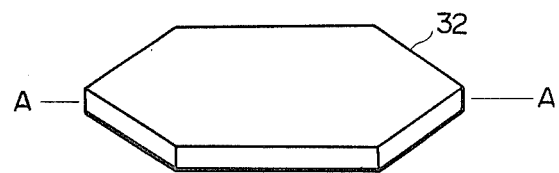
FIG. 5 to FIG. 7 are perspective views showing several modifications of the window means according to this invention.
Figure 8:
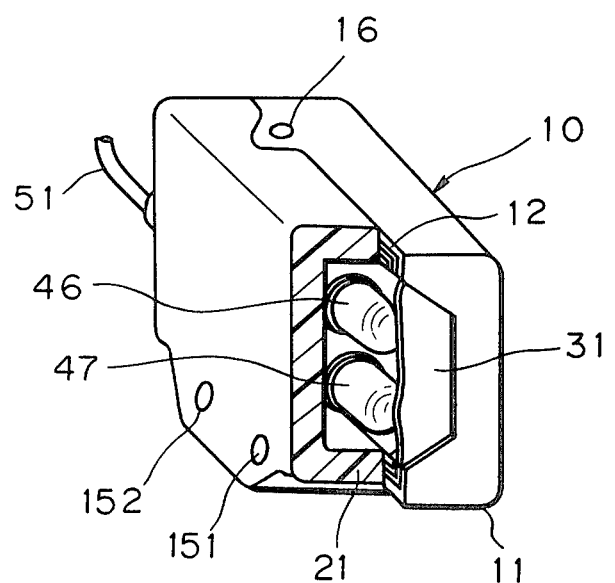
FIG. 8 is a partially cut away perspective view of the photoelectric switch of FIG. 1 having a light source and a light responsive element.

If desired, the switch may include both of a light source element and a light responsive element, or only a light source element. Insert FIG. 8 illustrates a switch including both elements with the light source element designated at 46 and the light responsive element designated at 47. When both of the light source element and light responsive element in a common housing are required, a window means having an increased size, as shown in FIG. 5, may be provided.

Figure 6:
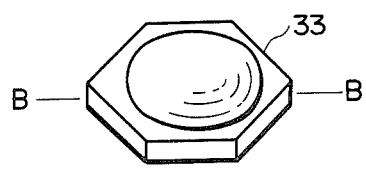
Figure 7:

Window means having configurations, as shown by reference numerals 33 and 34 in FIG. 6 and FIG. 7, respectively, may also be employed.

The configuration of each of the window means 32 and 33 is hexagonal, and that of window means 34 is lenticular. The window means 32, 33 or 34 is attached to the shells in such a manner that the diagonal line A—A or B—B, or apsis line C—C is coincident with the welding plane of the shells.

It will be readily seen that window means having other configurations may likewise be adopted only if they present none of its peripheral portion in parallel with the direction of welding pressure.

What is claimed is:

1. A photoelectric switch comprising:
   a housing consisting of two shells of opaque plastic material welded together by ultrasonic welding;
   a window means of transparent plastic material welded to said shells by said ultrasonic welding, said window means being formed and attached to said shells in such a manner that it includes no peripheral portion which is in parallel with a welding pressure direction of said ultrasonic welding;
   at least one electrooptical transducer disposed in said housing is a position to optically communicate with the exterior of said housing through said window means;
   an electrical circuit means placed in said housing and connected to said at least one electrooptical transducer; and
   an electric conductor connected to said electrical circuit means and led out of said housing.

2. A photoelectric switch as claimed in claim 1, wherein said window means has a polygonal configuration.

3. A photoelectric switch as claimed in claim 2, wherein said window means has a square configuration and a diagonal line which is coincident with a welding plane of said shells.

4. A photoelectric switch as claimed in claim 2, wherein said window means has a hexagonal configuration, a diagonal line of which is coincident with a welding plane of said shells.

5. A photoelectric switch as claimed in claim 1, wherein said window means has a lenticular configuration, the apsis line of which is coincident with a welding plane of said shells.

6. A photoelectric switch as claimed in claim 1, wherein said window means is a lens.

7. A photoelectric switch as claimed in claim 1, wherein said window means is an optical filter.

8. A photoelectric switch as claimed in claim 1, wherein said window means is positioned to one side of said housing and said electric conductor is led out of said housing from another side of the housing opposite to said one side.

9. A photoelectric switch as claimed in claim 1, wherein either one of said window means and said shells is provided with a peripheral projection to provide a fluid-tight engagement therebetween.

10. A photoelectric switch comprising:
    a housing of a rectangular prism configuration consisting of two shells of opaque plastic material welded together by ultrasonic welding;
    a window means of transparent plastic material welded to said shells by said ultrasonic welding, said window means being formed in a polygonal configuration and having a diagonal line which is coincident with a welding plane of said shells;
    a light source element and a light responsive element placed in said housing such that said light source element emits a light to the exterior of said housing and said light responsive element receives the light reflected from any article through said window means;
    an electrical circuit means placed in said housing and connected to said elements; and,
    an electric conductor connected to said electrical circuit means and extending out of said housing.

11. A photoelectric switch as claimed in claim 10, wherein either one of said window means and said shells is provided with a peripheral projection to provide a fluid-tight engagement therebetween.

* * * * *